United States Patent [19]
Ko et al.

[11] Patent Number: 5,980,188
[45] Date of Patent: Nov. 9, 1999

[54] SEMICONDUCTOR MANUFACTURING DEVICE INCLUDING SENSOR FOR SENSING MIS-LOADING OF A WAFER

[75] Inventors: Yong-in Ko; Jae-sang Park; Kyung-soo Kim; Jae-bum Park, all of Suwon, Rep. of Korea

[73] Assignee: Samsung Electronics Co., Ltd., Suwon, Rep. of Korea

[21] Appl. No.: 08/977,883

[22] Filed: Nov. 28, 1997

[30] Foreign Application Priority Data

May 9, 1997 [KR] Rep. of Korea ............... 97-17949

[51] Int. Cl.⁶ .................................................. G01B 11/04

[52] U.S. Cl. .................... 414/417; 414/936; 414/938

[58] Field of Search ................................. 414/417, 936, 414/938, 416; 901/47

[56] References Cited

U.S. PATENT DOCUMENTS

| | | | |
|---|---|---|---|
| 4,720,130 | 1/1988 | Andou | 414/938 |
| 4,721,427 | 1/1988 | Sanders et al. | 414/938 |
| 4,806,057 | 2/1989 | Cay et al. | 414/938 |
| 4,987,407 | 1/1991 | Lee | 414/938 |
| 5,266,812 | 11/1993 | Mokuo | 414/938 |
| 5,533,243 | 7/1996 | Asano | 414/938 |
| 5,836,736 | 11/1998 | Thompson et al. | 414/938 |

*Primary Examiner*—Christopher P. Ellis
*Assistant Examiner*—Isobel A. Parker
*Attorney, Agent, or Firm*—Jones Volentine, LLP

[57] ABSTRACT

An apparatus and method for carrying wafers through a multi-step process for producing a semiconductor, without using a cassette, where the apparatus senses whether a wafer is mis-loaded. The apparatus includes a plurality of optical sensors positioned above the wafers for sensing whether a wafer is mis-loaded by transmitting light past circumferential edges of the wafers.

14 Claims, 2 Drawing Sheets

SEMICONDUCTOR MANUFACTURING DEVICE INCLUDING SENSOR FOR SENSING MIS-LOADING OF A WAFER

BACKGROUND OF THE INVENTION

1. Field of the Invention

The present invention relates to an apparatus and method for manufacturing a semiconductor device. More particularly, the present apparatus is used to carry a wafer during the semiconductor manufacturing process and includes a sensor for sensing a mis-loaded wafer.

2. Description of the Related Art

Semiconductor devices are manufactured through a multi-step process. A wafer, held in a cassette, is transferred through each step of the process until the semiconductor device is complete. During the multi-step process, one or more of the wafers may be removed or added from the cassette and subjected to a subsequent process step, either individually or in a batch mode. For example, during a wet etching step or a cleaning step, the cassette containing the wafers is placed in a processing bath containing a reactive solution for batch processing. In this case, the cassette is composed of a material, e.g., quartz or TEFLON (a non-stick, heat resistant coating), which is stable in the presence of the reactive solution.

However, as the diameter of the wafer increases beyond the standard eight inch wafer currently used, the size of a cassette necessary to hold and transfer the wafer would be too large to employ with standard manufacturing equipment. One solution would be to enlarge the manufacturing equipment to accommodate the larger sized cassette; however, the cost involved in increasing the size of the manufacturing equipment is prohibitive.

A more cost-effective method employs a guide with a plurality of slots, where the wafers are unloaded onto the guide from the cassette and subsequently moved to a second guide in a processing bath by a robot arm. The guide is illustrated in FIG. 1.

In FIG. 1, the plurality of wafers 20 are separated from the cassette and loaded onto the guide 10 having a plurality of slots 30. A wafer 20A is shown improperly loaded in slot 30 of guide 10. In the device illustrated in FIG. 1, it is impossible to determine whether there are any mis-loaded wafers. An undetected mis-loaded wafer 20A can be dropped and broken during transfer to a second guide, for example, a guide in a processing bath having the same pitch. Also, a wafer 20, during transfer to the second guide may be mis-loaded onto the second guide and dropped in the processing bath, resulting in wafers of different batches mixing in the same processing bath.

SUMMARY OF THE INVENTION

It is an object of the present invention to provide an apparatus for carrying a wafer which senses mis-loaded wafers.

It is another object of the present invention to provide a semiconductor manufacturing device including the present apparatus for carrying a wafer.

It is still another object of the present invention to provide a method for carrying a wafer and sensing mis-loaded wafers using the present apparatus for carrying a wafer.

To achieve these and other objects, the present invention provides for an apparatus for sensing a mis-loaded wafer, having a cassette with an open top surface for receiving a plurality of wafers, and an opposing partially open bottom surface. The apparatus includes a cassette support which horizontally supports the cassette, with the cassette support having a support opening formed corresponding to the partially opened bottom surface of the cassette. A moving means is connected to the cassette support for moving the cassette support up and down, and a guide is disposed in the support opening. The guide has a plurality of slots to receive corresponding of the plurality of wafers. A sensor housing, positioned above the cassette, has a plurality of sensors provided on the sensor housing and aligned with a circumferential edge of a properly positioned wafer for sensing a mis-loaded wafer.

In another aspect, the present invention provides a method for carrying a plurality of wafers loaded in a cassette to a processing bath for performing a process, comprising the steps of: unloading the plurality of wafers from the cassette to a first guide; separating the plurality of wafers from the cassette; transmitting light past circumferential edges of the plurality of wafers; sensing whether one or more wafers are mis-loaded; and carrying only properly loaded wafers to a second guide in the processing bath.

According to a preferred embodiment of the present invention, the sensor is an optical sensor. Suitable optical sensors include, for example, a photo sensor, a laser sensor, and a fiber-optic sensor. The optical sensor is installed such that light is transmitted perpendicular to the surfaces of the plurality of wafers along the circumferential edge of the wafers. The optical sensor thus senses whether the wafer is properly loaded by transmitting and/or receiving light.

The present semiconductor manufacturing device including the present apparatus for carrying a wafer is preferably used in a wet process. The apparatus prevents wafers from being broken or mixed during processing, by monitoring wafers which are not correctly loaded into slots of the guide before starting the process.

BRIEF DESCRIPTION OF THE DRAWINGS

The accompanying drawings illustrate an embodiment of the invention, in which.

DESCRIPTION OF THE PREFERRED EMBODIMENTS

Figure 1:
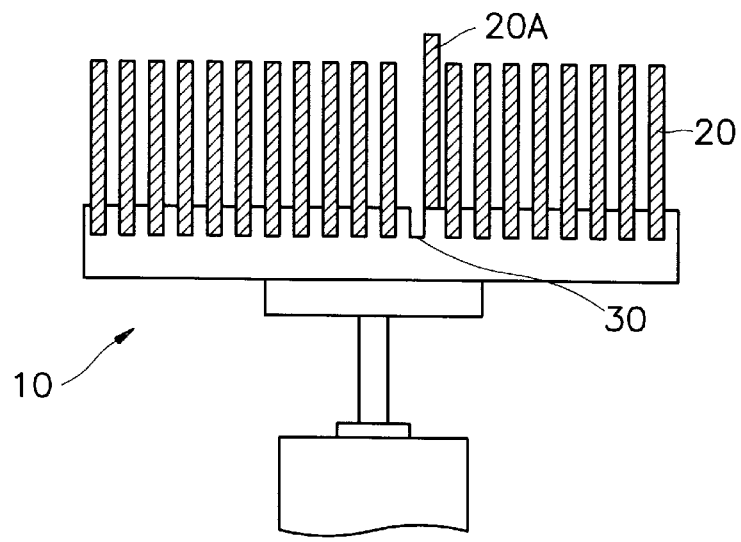
FIG. 1 is a sectional view showing wafers loaded on a conventional guide.

Hereinafter, the present invention will be described in detail with reference to the attached drawings. However, the present invention is not restricted to the embodiments provided hereinafter and many variations are possible. The present embodiments are provided to describe the present invention and to indicate the scope of the invention to those who are skilled in the art. In the attached drawings, a sensor is exaggerated in order to clarify the characteristics of the present invention. Identical reference numerals indicate like elements throughout.

Figure 2:
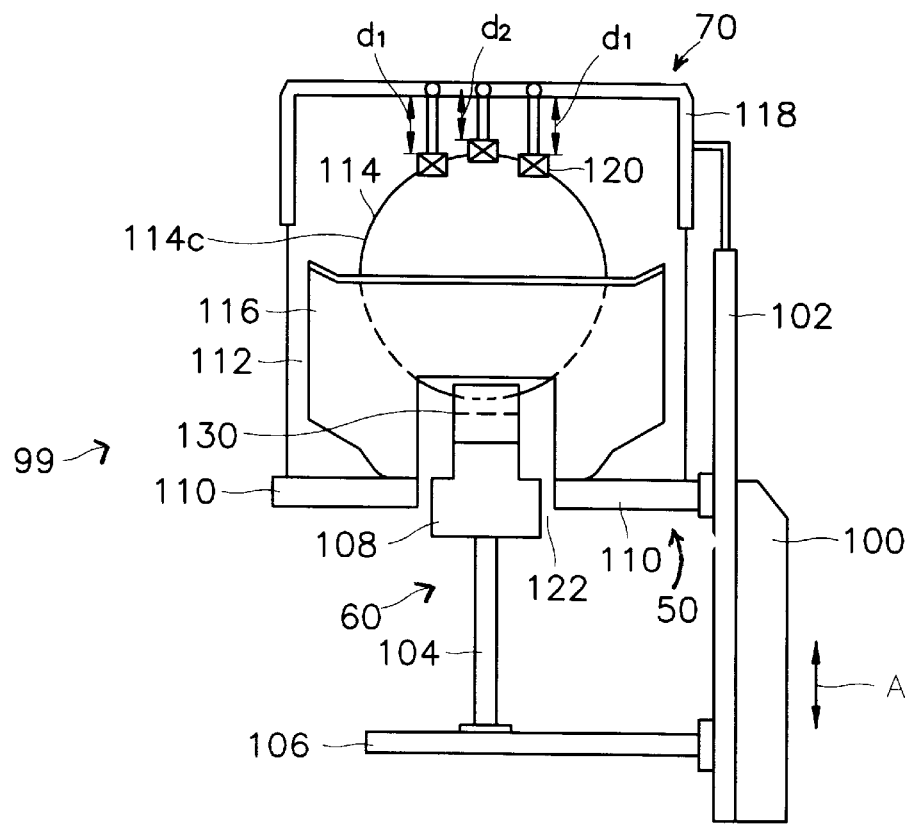
FIG. 2 is a front view of an apparatus for sensing a misloaded wafer in accordance with the present invention.

FIG. 2 is a front view of the present wafer carrying apparatus 99, which generally comprises a cassette carrying section 50, a guide section 60, and a sensor section 70.

The cassette carrying section 50 comprises a cassette moving means including a movable cylinder 100 attached to a stationary cylinder support 102, and a cassette support 110.

Cassette support 110 horizontally supports a cassette 116 loaded with a plurality of wafers 114. Cassette support 110 includes an opening 122 formed corresponding to an opening in the lower surface of the cassette 116 for exposing a lower part of the wafer 114. The cassette support 110 is connected to cylinder 100 through the stationary cylinder support 102, such that the cassette support 110 and cassette 116 thereon move up and down with respect to the wafer guide 108.

The guide section 60 includes a guide fixing shaft 104, a guide support 106 connected to the stationary cylinder support 102, and the wafer guide 108, installed in the cassette support opening 122, in which a plurality of slots 130 (shown as dashed lines in FIG. 2) are formed. When the cassette 116 loaded with a plurality of wafers 114 is placed on the cassette support 110 and fixed by a cassette support plate 112, the wafers 114 are aligned with and loaded into, the slots 130 of the guide 108.

The sensor section 70 includes a sensor housing 118 connected to the stationary cylinder support 102 and a plurality of sensors 120 being installed on the sensor housing 118. The sensors 120 preferably use light as a sensing medium.

Figure 3:
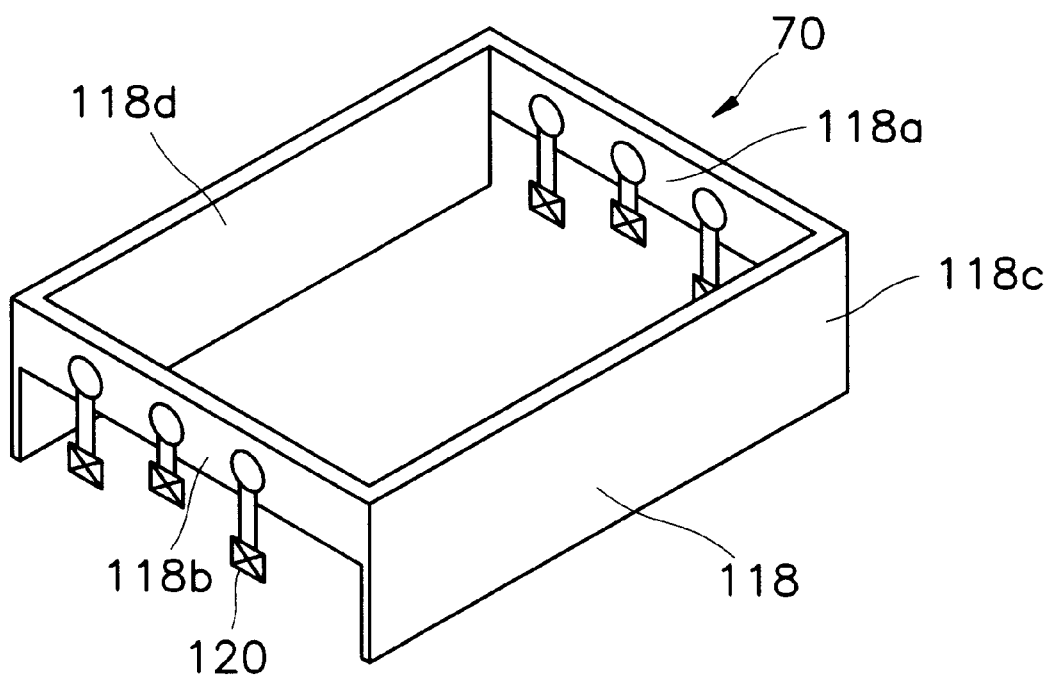
FIG. 3 is a perspective view of the sensing section of the present inventive apparatus.

FIG. 3 illustrates an enlarged perspective view of the sensor section 70. The sensor housing 118 has a pair of first parallel plates 118a, 118b, on which a plurality of sensors 120 are installed, and a pair of second parallel plates 118c, 118d, connected perpendicular to the first parallel plates to form a box-shaped housing. The sensor housing 118 thus forms a rectangular or square column whose upper and lower surfaces are removed, and which has an open central region.

The sensors 120 extend downwardly from first parallel plates 118a, 118b at various distances such that each of the sensors 120 are aligned with the circumferential edge 114c of the wafer 114 (see FIG. 2). As shown in FIG. 2, two of the sensors 120 extend from the housing 118 at a first distance $d_1$, and one sensor extends from the housing 118 at a second distance $d_2$. The distances $d_1$ and $d_2$ are equal to the distance from the circumferential edge 114c of the wafer 114 to the sensor housing, as measured after the wafers 114 have been properly loaded in the guide 108.

The sensors 120 are preferably optical sensors including for example, a photosensor, a laser sensor, and a fiber-optic sensor. As shown in FIGS. 2 and 3, a first plurality of optical sensors 120 are provided on one of the first pair 118a of opposing parallel plates, which plurality of optical sensors transmit light past the circumferential edge 114c of the wafer 114, and a second plurality of optical sensors 120 are provided on the other of the first pair of opposing parallel plates 118b, which receive the transmitted light. The transmitting and receiving sides could be switched within the scope of the present invention. Also, each of the optical sensors 120 may include light emitting means and light receiving means. Note that the optical sensor is installed such that the transmitted or received light travels along the circumferential edges 114c of the wafers 114.

When one of the wafers 114 is mis-loaded into the slots of the guide 108, like the wafer 20A of FIG. 1, the light emitted from the light sensor 120 is interrupted and the mis-loaded wafer is thereby detected. When a mis-loaded wafer is sensed, the semiconductor manufacturing device would be configured to stop and sound an alarm, thereby alerting the operator to the problem. An alarm system can be implemented by modifying the program of the programmable logic controller (PLC), which controls the operation of the particular piece of manufacturing equipment and the sensors 120.

The present wafer carrying apparatus shown in FIGS. 2 and 3 is preferably installed in a wafer loading portion of a semiconductor manufacturing device to improve yields by preventing wafer breakage and mixing during a designated manufacturing process.

The present method for carrying wafers and detecting misloaded wafers will now be discussed with reference to FIGS. 2 and 3.

First, the cassette 116, loaded with a plurality of wafers 114, is placed onto the cassette support 110. The cassette support 110, connected to the movable cylinder 100 through the stationary cylinder support 102, is slowly moved downward by operating the movable cylinder 100. Since only the cassette 116 on the cassette support 110 moves downward, the plurality of wafers 114 located in the slots 130 of the guide 108 are separated from the cassette 116. The sensors 120 may commence operations, for example, when the cassette support 110 has descended approximately ⅓ of the total downward distance. Another interval for commencing the sensing operation may be selected within the scope of the present invention, as long as there is sufficient time for the wafers 114 to properly seat in the slots 130 of the guide 108 as the cassette 116 separates from the wafers 114.

A set of sensors 120 are positioned at each end of the sensor housing 118 to transmit and/or receive light past the circumferential edge 114c of the exposed wafers 114. Therefore, any wafer 114 which is not correctly loaded into the slot 130 of the guide 108 interrupts the path of light. Accordingly, the mis-loaded wafer is detected. When there is a mis-loaded wafer, the semiconductor manufacturing device (not shown) including the wafer carrying apparatus 99 stops operating so that the problem can be corrected.

When all of the wafers are properly loaded and no mis-loaded wafers are detected, the wafers 114 are completely separated from the cassette 116 by moving the cassette support 110 further downward using cylinder 100, until the cassette 116 is moved completely away from the wafers 114. The separated plurality of wafers 114 may then be moved, for example, by a robot arm (not shown) to the second guide (not shown) in a processing bath to carry out a wet process.

It will be apparent to those skilled in the art that various modifications and variations can be made in the present invention without departing from the spirit or scope of the invention. Thus, it is intended that the present invention cover the modifications and variations of this invention that come within the scope of the appended claims and their equivalents.

What is claimed is:

1. An apparatus for sensing a mis-loaded wafer, having a cassette with an open top surface for receiving a plurality of wafers, and an opposing, partially-open bottom surface, said apparatus comprising:

a cassette support, which horizontally supports said cassette, said cassette support having a support opening formed corresponding to said partially opened bottom surface of said cassette;

moving means connected to said cassette support for moving said cassette support up and down;

a guide disposed in said support opening and having a plurality of slots to receive corresponding ones of said plurality of wafers;

a sensor housing positioned above said cassette;

a first plurality of sensors provided on said sensor housing and transmitting light past circumferential edges of the wafers in a direction substantially perpendicular to top and bottom surfaces of the wafers; and a second plurality of sensors for receiving the transmitted light and for sensing a vertically mis-loaded wafer.

2. The apparatus of claim 1, said sensor housing comprising:

a first pair of opposing parallel plates formed parallel to top and bottom surfaces of said wafers, said plates separated from each other by a predetermined distance; and a second pair of opposing parallel plates, formed perpendicular to said first pair of parallel plates, said second pair of parallel plates separated from each other by a predetermined distance.

3. The apparatus of claim 2, wherein said plurality of sensors are disposed on said first pair of opposing parallel plates.

4. The apparatus of claim 3, wherein said sensors are optical sensors.

5. The apparatus of claim 4, wherein said optical sensors are selected from the group consisting of a photo sensor, a laser sensor, and a fiber-optic sensor.

6. An apparatus for sensing a mis-loaded wafer, having a cassette with an open top surface for receiving a plurality of wafers, and an opposing, partially-open bottom surface, the apparatus comprising:

a cassette support, which horizontally supports the cassette, the cassette support having a support opening formed corresponding to the partially opened bottom surface of the cassette;

moving means connected to the cassette support for moving the cassette support up and down;

a guide disposed in the support opening and having a plurality of slots to receive corresponding ones of the plurality of wafers;

a sensor housing positioned above the cassette, the sensor housing comprising a first pair of opposing parallel plates formed parallel to top and bottom surfaces of the wafers, the plates separated from each other by a predetermined distance; and a second pair of opposing parallel plates, formed perpendicular to the first pair of parallel plates, the second pair of parallel plates separated from each other by a predetermined distance; and a plurality of optical sensors disposed on the first pair of opposing parallel plates and aligned with a circumferential edge of a properly positioned wafer, for sensing a misloaded wafer, wherein the optical sensors are selected from the group consisting of a photo sensor, a laser sensor, and a fiber-optic sensor, and wherein the optical sensors extend downwardly from the sensor housing at designated distances equal to corresponding distances from the sensor housing to the circumferential edge of the properly positioned wafer.

7. The apparatus of claim 6, said optical sensors comprising a first plurality of optical sensors provided on one of said first pair of opposing parallel plates, which plurality of optical sensors transmit light past said circumference of said wafer, and a second plurality of optical sensors provided on another of said first pair of opposing parallel plates, which receive said transmitted light.

8. A method for carrying a plurality of wafers loaded in a cassette to a processing bath for performing a process, comprising the steps of:

unloading said plurality of wafers from said cassette to a first guide;

separating said plurality of wafers from said cassette;

operating a first plurality of optical sensors to transmit light past the circumferential edges of the wafers, in a direction substantially perpendicular to top and bottom surfaces of the wafers;

simultaneously operating a second plurality of optical sensors to receive the transmitted light to sense whether one or more wafers are mis-loaded; and carrying only properly loaded wafers to a second guide in said processing bath.

9. The method of claim 8, said unloading step comprising steps of:

placing said cassette having said plurality of wafers onto a cassette support; and transferring said plurality of wafers from slots in said cassette to corresponding slots in said first guide, said first guide being positioned in an opening in said cassette support below said cassette.

10. The method of claim 9, said separating step comprising a step of:

lowering said cassette support relative to said guide using a moving means connected to said cassette support, wherein said plurality of wafers stay positioned in said slots of said guide as said cassette support moves downwardly with respect to said guide.

11. The method of claim 8, wherein if said second plurality of optical sensors receives said transmitted light, then all of said plurality of wafers are properly positioned, and if second plurality of optical sensors does not receive said transmitted light, then one or more of said plurality of wafers are mis-loaded.

12. The method of claim 11, wherein said optical sensors in said sensing step are selected from the group consisting of a photo sensor, a laser sensor, and a fiber-optic sensor.

13. The method of claim 8, wherein said steps of unloading, separating transmitting, sensing, and carrying, are controlled by a programmable logic controller (PLC).

14. The method of claim 8, wherein said transmitting and sensing steps commence after said cassette support moves downwardly one-third of a total downward movement distance required for the cassette support to be moved completely away from the wafers.

* * * * *